United States Patent
Tadjer et al.

(10) Patent No.: US 10,403,509 B2
(45) Date of Patent: Sep. 3, 2019

(54) BASAL PLANE DISLOCATION ELIMINATION IN 4H—SIC BY PULSED RAPID THERMAL ANNEALING

(71) Applicants: Marko J. Tadjer, Springfield, VA (US); Boris N. Feigelson, Springfield, VA (US); Nadeemullah A. Mahadik, Springfield, VA (US); Robert E. Stahlbush, Silver Spring, MD (US); Eugene A. Imhoff, Washington, DC (US); Jordan Greenlee, Alexandria, VA (US)

(72) Inventors: Marko J. Tadjer, Springfield, VA (US); Boris N. Feigelson, Springfield, VA (US); Nadeemullah A. Mahadik, Springfield, VA (US); Robert E. Stahlbush, Silver Spring, MD (US); Eugene A. Imhoff, Washington, DC (US); Jordan Greenlee, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/679,254

(22) Filed: Apr. 6, 2015

(65) Prior Publication Data

US 2015/0287613 A1    Oct. 8, 2015

Related U.S. Application Data

(60) Provisional application No. 61/975,098, filed on Apr. 4, 2014.

(51) Int. Cl.
*H01L 29/15* (2006.01)
*H01L 21/324* (2006.01)
(Continued)

(52) U.S. Cl.
CPC ........ *H01L 21/3247* (2013.01); *H01L 21/324* (2013.01); *H01L 21/02529* (2013.01);
(Continued)

(58) Field of Classification Search
CPC ............. H01L 21/02167; H01L 21/324; H01L 29/1608
(Continued)

(56) References Cited

U.S. PATENT DOCUMENTS

| 5,993,770 A | * | 11/1999 | Kuroyanagi | ............ C01B 31/36 117/95 |
| 6,063,514 A | * | 5/2000 | Nishioka | ............... C04B 41/009 428/312.6 |

(Continued)

FOREIGN PATENT DOCUMENTS

CN    102664151 A  *  9/2012    ........... H01L 21/324

OTHER PUBLICATIONS

Mahadik et al., "Multi-Cycle High Temperature Rapid Thermal Annealing for Dislocation Elimination in 4H—SiC Epitaxy", ECS Transactions 64 (2014) pp. 35-39.*

(Continued)

*Primary Examiner* — Jay C Kim
(74) *Attorney, Agent, or Firm* — US Naval Research Laboratory; Rebecca L. Forman

(57) ABSTRACT

A method for removing existing basal plane dislocations (BPDs) from silicon carbide epilayers by using a pulsed rapid thermal annealing process where the BPDs in the epilayers were eliminated while preserving the epitaxial surface. This high temperature, high pressure method uses silicon carbide epitaxial layers with a carbon cap to protect the surface. These capped epilayers are subjected to a plurality of rapid heating and cooling cycles.

6 Claims, 2 Drawing Sheets

(51) Int. Cl.
*H01L 29/16* (2006.01)
*H01L 21/02* (2006.01)

(52) U.S. Cl.
CPC .. *H01L 21/02609* (2013.01); *H01L 21/02667* (2013.01); *H01L 29/1608* (2013.01)

(58) Field of Classification Search
USPC .......................................... 257/77; 438/931
See application file for complete search history.

(56) References Cited

U.S. PATENT DOCUMENTS

| | | | | |
|---|---|---|---|---|
| 6,214,108 | B1* | 4/2001 | Okamoto | C30B 23/00 117/88 |
| 6,515,297 | B2* | 2/2003 | Takeda | C23C 16/325 117/88 |
| 7,462,540 | B2* | 12/2008 | Takahashi | H01L 21/046 257/E21.057 |
| 7,473,929 | B2* | 1/2009 | Kusumoto | H01L 21/046 257/288 |
| 7,718,519 | B2* | 5/2010 | Takahashi | H01L 21/046 257/E21.054 |
| 7,732,739 | B2* | 6/2010 | Shibagaki | H01L 21/324 118/50.1 |
| 7,807,553 | B2* | 10/2010 | Shibagaki | H01L 21/046 118/725 |
| 7,820,534 | B2* | 10/2010 | Sawada | H01L 21/045 257/77 |
| 7,851,382 | B2* | 12/2010 | Nakamura | H01L 21/046 257/77 |
| 7,994,027 | B2* | 8/2011 | Tian | C23C 14/025 117/84 |
| 8,084,278 | B2* | 12/2011 | Uda | C23C 16/325 438/14 |
| 8,114,783 | B2* | 2/2012 | Kawada | H01L 21/0485 257/597 |
| 8,242,030 | B2* | 8/2012 | Hannon | H01L 29/16 257/77 |
| 8,470,699 | B2* | 6/2013 | Suzuki | H01L 21/324 438/518 |
| 8,492,774 | B2* | 7/2013 | Kusunoki | C30B 19/02 257/77 |
| 8,518,808 | B2* | 8/2013 | Feigelson | H01L 21/26546 257/E21.077 |
| 8,592,267 | B2* | 11/2013 | Yamazaki | H01L 21/76254 257/77 |
| 8,697,555 | B2* | 4/2014 | Fujikawa | H01L 21/046 117/217 |
| 8,883,619 | B2* | 11/2014 | Tamaso | H01L 29/66068 257/E21.334 |
| 9,129,799 | B2* | 9/2015 | Mahadik | C30B 29/36 |
| 2007/0015373 | A1* | 1/2007 | Cowen | H01L 21/046 438/758 |
| 2007/0110657 | A1* | 5/2007 | Hunter | C30B 23/00 423/345 |
| 2008/0090383 | A1* | 4/2008 | Nakamura | H01L 21/046 438/465 |
| 2008/0132047 | A1* | 6/2008 | Dunne | H01L 21/2258 438/527 |
| 2011/0203513 | A1* | 8/2011 | Watanabe | C30B 29/36 117/54 |
| 2011/0287618 | A1* | 11/2011 | Suzuki | H01L 21/324 438/542 |
| 2012/0037067 | A1* | 2/2012 | Watanabe | C30B 25/14 117/89 |
| 2014/0220296 | A1* | 8/2014 | Loboda | C30B 23/005 428/131 |

OTHER PUBLICATIONS

Rao, "Ultra-Fast Microwave Heating for Large Bandgap Semiconductor Processing", www.intechopen.com (2011).*
Sundaresan et al., "Comparison of Solid-State Microwave Annealing with Conventional Furnace Annealing of Ion-Implanted SiC", Journal of Electronic Materials 36 (2007) pp. 324-331.*
Yellai, "Post Ion Implantation Surface Planarization Process for 4H—SiC Wafers using Carbon Encapsulation Technique", Master of Science Degree Thesis (2006).*
Nipoti et al., "Carbon-Cap for Ohmic Contacts on Ion-Implanted 4H—SiC", Electrochemical and Sold-State Letters 13 (2010) H432-H435.*
Leone et al., "Growth of smooth 4H—SiC epilayers on 4o off-axis substrates with chloride-based CVD at very high growth rate", Materials Research Bulletin 46 (2011) pp. 1272-1275.*
Zhang et al., "Conversion of basal plane dislocations to threading edge dislocations in 4H—SiC epilayers by high temperature annealing", Journal of Applied Physics 111 (2012) 123512.*
Chung et al., "Direct observation of basal-plane to threading-edge dislocation conversion in 4H—SiC epitaxy", Journal of Applied Physics 109 (2011) 094906.*
Shirasawa et al., "Epitaxial Silicon Oxynitride Layer on a 6H—SiC(0001) Surface", Physicsl Review Letters 98 (2007) 136105.*
Wu et al., "Effect of annealing process on the surface roughness in multiple Al implanted 4H—SiC", Journal of Semiconductors 32 (2011) 072002.*
Tamaso et al., "Development of Fast-Switching SiC Transistor", SEI Technical Review 66 (2008) pp. 43-49.*
Negoro et al., "Electronic behaviors of high-dose phosphorus-ion implanted 4H—SiC (0001)", Journal of Applied Physics 96 (2004) pp. 224-228.*
Nipoti et al., "Conventional thermal annealing for a more efficient p-type doping of Al+ implanted 4H—SiC", Journal of Materials Research 28 (2013) pp. 17-22.*
Ayedh et al., "Formation of carbon vacancy in 4H silicon carbide during high-temperature processing", Journal of Applied Physics 115 (2014) 012005.*
Zippelius et al., "High temperature annealing of n-type 4H—SiC: Impact on intrinsic defects and carrier lifetime", Journal of Applied Physics 111 (2012) 033515.*
Negoro et al., "Electrical activation of high-concentration aluminum implanted in 4H—SiC", Journal of Applied Physics 96 (2004) pp. 4916-4922.*
Wood et al., "Comparison of Graphite and BN—AlN Annealing Caps for Ion Implanted SiC", Materials Science Forum (2007).*
Bergman et al., "Crystal Defects as Source of Anomalous Forward Voltage Increase of 4H—SiC Diodes," Mat. Sci. Forum, 353, 299 (2001).
Stahlbush et al., "Propagation of Current-Induced Stacking Faults and Forward Voltage Degradation in 4H—SiC PiN Diodes," Mat. Sci. Forum, 389, 427 (2002).
Ha et al., "Driving Force of Stacking-Fault Formation in SiC p-i-n Diodes," Phys. Rev. Lett., 92, 175504 (2004).
Myers-Ward et al., "Turning of Basal Plane Dislocations During Epitaxial Growth on 4° off-axis 4H—SiC," Mat. Sci. Forum, 615-617, 105 (2009).
Mahadik et al., "Post-Growth Reduction of Basal Plane Dislocations by High Temperature Annealing in 4H—SiC Epilayers," Mat. Sci. Forum, 778-780, 324 (2014).
Anderson et al., "Activation of Mg implanted in GaN by multicycle rapid thermal annealing," Elect. Lett., 50, 197 (2014).
Feigelson et al., "Multicycle rapid thermal annealing technique and its application for the electrical activation of Mg implanted in GaN," J. Crystal Growth, 350, 21-26 (2012).

* cited by examiner

BASAL PLANE DISLOCATION ELIMINATION IN 4H—SIC BY PULSED RAPID THERMAL ANNEALING

PRIORITY CLAIM

The present application is a non-provisional application claiming the benefit of U.S. Provisional Application No. 61/975,098, filed on Apr. 4, 2014 by Marko J. Tadjer et al., entitled "Basal Plane Dislocation Elimination in 4H—SiC by Multi-Cycle Rapid Thermal Annealing," the entire contents of which is incorporated herein by reference.

BACKGROUND OF THE INVENTION

Field of the Invention

The present invention relates to the removal of basal plane dislocations in silicon carbide (SiC) epitaxially grown layers.

Description of the Prior Art

High power devices fabricated in 4H-silicon carbide (SiC) epilayers are known to suffer from forward voltage degradation caused by basal plane dislocation (BPD) induced stacking faults (SF). (J. P. Bergman et al., Mater. Sci. Forum 353, 299 (2001) and R. E. Stahlbush et al., Mater. Sci. Forum 389, 427 (2002)). Over the past decade, several efforts have been successful in removal of more than 90% of the BPDs in the substrate by converting them to benign threading edge dislocations (TED) during epigrowth. (S. Ha et al., Phys. Rev. Lett. 92, 175504 (2004) and R. L. Myers-Ward et al., Mat. Sci. Forum 615-617, 105 (2009)). However, BPDs in the many areas of the epilayers are still >100 cm$^{-2}$, which adversely affects the device yield and reliability.

A previous report for BPD removal was published by Mahadik et al., detailing a conventional annealing process which was less effective in preserving the SiC surface than the technique presented herein. (N. A. Mahadik et al., Materials Science Forum Vols. 778-780, pp 324-327 (2014)).

Using multiple heating and cooling cycles has been previously reported for electrical activation of implanted Mg ions in gallium nitride (GaN) and removal of defects introduced during this implantation step. (T. J. Anderson et al., Elect. Lett. 50, 197 (2014); B. N. Feigelson et al., J. Crystal Growth, vol. 350, no. 1, pp. 21-26 (2012); and B. N. Feigelson et al., U.S. Pat. No. 8,518,808 (2013)).

BRIEF SUMMARY OF THE INVENTION

The present invention provides a means to remove basal plane dislocations already present in silicon carbide (SiC) epitaxially grown layers, while preserving the surface morphology. This method uses a high temperature annealing process under high ambient pressure in ultrapure inert atmosphere and utilizes a surface protective coating on epitaxially grown SiC layers to remove the basal plane dislocations present in it. Unlike previous methods, the high temperature anneal is performed in pulses of very high temperature, leading to an elimination of defects while preserving the surface of the material over a large area.

The subject of the invention is single crystal Silicon Carbide (SiC) substrate material and epilayers grown by any typical methods. This invention provides means to remove defects, while preserving the sample surface in SiC semiconductors.

The invented method uses a high temperature annealing process under gas pressure above atmospheric and utilizes a surface protective coating to eliminate basal plane dislocations (BPD) in SiC samples. More specifically, the high temperature annealing process is one where the temperature profile is pulsed in individual cycles of high temperature and short duration. Even more specifically, the high temperature annealing process is one where the material is subjected to a plurality of short (rapid) heating and cooling cycles without removing the sample from the enclosure.

The present invention can be used to remove BPDs from SiC epitaxial layers after their growth, while preserving the surface morphology. This is important to realize high power density and high voltage SiC devices.

The present invention can be used to transform point defects in SiC and change optical and electrical properties of SiC.

The present invention can be used to anneal n-type and p-type implants in SiC to form higher conductivity n-type and p-type semiconductor regions, while preserving the surface.

The present invention can be used to perform high temperature treatments to SiC to improve carrier lifetime in both p-type and n-type SiC layers.

In an embodiment where the surface does not have a protective coating, this invention can be used to grow Si— or C— containing compounds, such as $SiN_x$ or graphene.

The present invention has many advantages. It results in elimination of BPDs in SiC material, while maintaining good surface morphology. Compared to previously reported methods, the present invention uses higher temperature annealing (up to 1875° C., but higher is possible) of SiC material with no silicon sublimation from the surface, which prevents surface degradation. This higher temperature annealing could be used to improve the activation/incorporation of implanted species in the SiC lattice.

These and other features and advantages of the invention, as well as the invention itself, will become better understood by reference to the following detailed description, appended claims, and accompanying drawings.

BRIEF DESCRIPTION OF THE DRAWINGS

FIG. 2a shows that conventional annealing at above 1750° C. results in an RMS roughness of 5.7 nm. FIG. 2b shows that pulsed rapid thermal annealing results in an RMS roughness of 3.1 nm.

FIG. 2a shows a typical UVPL image of an as grown sample showing a BPD density of ~1000 cm$^{-2}$. The short horizontal white lines are BPDs. FIG. 2b shows an UVPL sample after pulsed rapid thermal annealing at 1875° C. for 5 min., with no BPDs. The long scratch line is scribe mark on backside for sample identification.

DETAILED DESCRIPTION OF THE INVENTION

The present invention provides a technique to remove the existing BPDs from the epilayers by using a pulsed rapid thermal annealing process where the BPDs in the epilayers were eliminated, while preserving the epitaxial surface. This high temperature, high pressure method uses silicon carbide epitaxial layers with a carbon cap to protect the surface. These capped epilayers are subjected to a plurality of rapid heating and cooling cycles.

The method of the present invention may be briefly described as follows. First silicon carbide epilayers are capped with carbon to protect the surface. Other than a carbon cap, materials, including boron nitride, can be used as well. Unlike the MRTA process described by Feigelson et al., where the AN capping layer is able to absorb and protect the GaN surface from trace amounts of oxygen in the inert annealing atmosphere, the presently described method depends on nearly complete removal of any and all trace amounts of oxygen during the process. The capped silicon carbide epilayers are then placed inside an enclosure, and overpressure of ultra-purified nitrogen is applied. The capped epilayers are then annealed with a plurality of heating and cooling cycles without removing them from the enclosure between cycles. There should be no oxygen present during the annealing process. Each heating and cooling cycle includes heating the epilayers for several seconds to a temperature above 1750° C., more preferably above 1800° C. and even more preferably up to 1875° C. or above, and rapidly cooling the epilayers for several seconds to a temperature below 1550° C. In a preferred embodiment, at the end of the plurality of heating and cooling cycles, the capped silicon carbide epilayers have been heated to a temperature between 1750 and 1875° C. for at least five minutes.

In this invention, we used 4° offcut, 15 µm, n-type $6 \times 10^{15}$ cm$^{-3}$ 4H—SiC epilayers, commercially obtained. The samples were then carbon capped using the following process. The samples were cleaned with a pirana solution consisting of $H_2SO_4$:$H_2O_2$:$H_2O$ in the ratio 1:1:5, followed by a solvent clean (SC-1) process. Then AZ 4620 photoresist was applied using a revolution speed of 5000 rpm for 1 minute. The samples were then introduced in an annealing chamber and kept under ultrapure nitrogen to eliminate traces of oxygen and produce a high quality carbon capping layer. The samples were then heated to a temperature of 1100° C. in ultrapure nitrogen ambient for 30 minutes to form the high quality carbon cap. This was followed by the high temperature high pressure annealing process.

Figure 1:
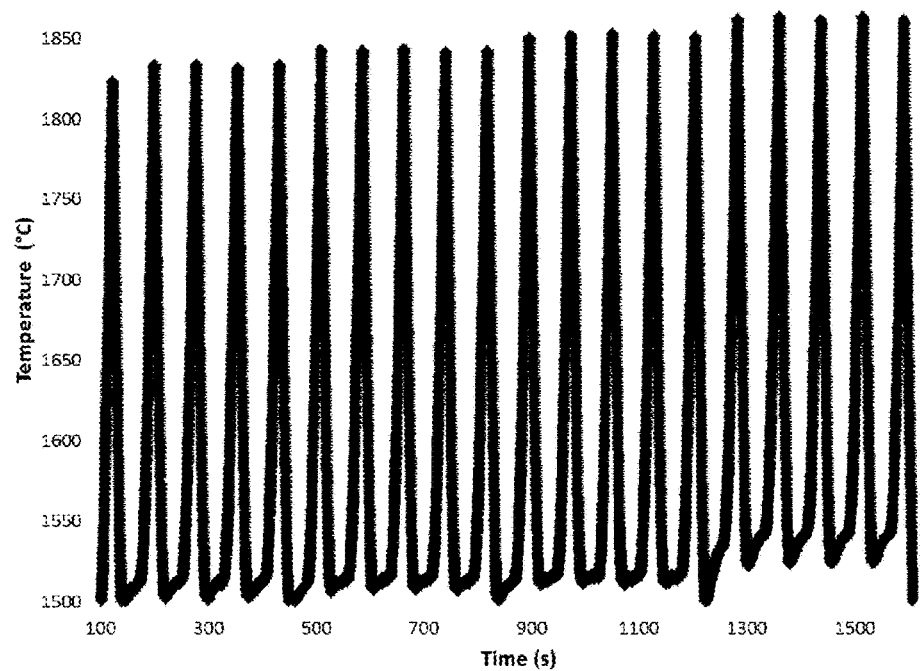
FIG. 1 shows a temperature profile of the pulsed rapid thermal annealing technique.

The as-grown samples were imaged using ultraviolet photoluminescence (UVPL) imaging, which shows the BPDs in the epitaxial layers. Carriers were excited with the 334 nm line from an Ar-ion laser, and images were collected in the emission range of 600-1000 nm. The samples were carbon capped and annealed in 20 cycles as shown in FIG. 1. The sample was at an annealing temperature of 1750-1875° C. for a total time of ~5 minutes (FIG. 1). The annealing was performed in a custom designed chamber with inductive sample heating and ultrapure $N_2$ overpressure at 0.41-0.76 MPa. The base temperature was maintained near 1500° C., from where the temperature was ramped up and down to the desired temperature in rapid cycles to accumulate sufficient time at the desired high temperature range. The combination of high $N_2$ overpressure and rapid cycles enabled higher temperature annealing than what conventional methods allow, while preserving the carbon cap, and thus maintaining a pristine epitaxial surface.

Elimination of oxygen during the annealing process was critical to the success of this process. All gas process lines were purged for a long time with ultrapure nitrogen. Maximum inertness of the annealing atmosphere in the chamber was ensured by multiple fills with ultrapure nitrogen. The SiC samples were enclosed in a carbon cap which additionally protected the sample surface from oxygen-induced decomposition.

Figure 2:
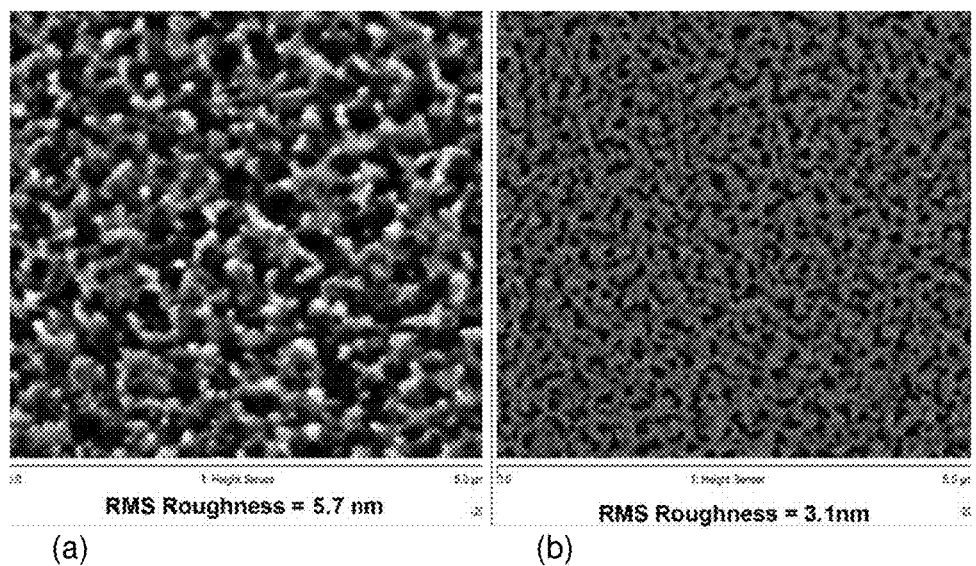
FIG. 2 compares the surface morphology using conventional annealing with using the pulsed rapid thermal annealing of the present invention.

Post-annealed samples were also imaged to observe the BPDs in the epilayers. The UVPL images of the as grown samples showed an average BPD density ~1000 cm$^{-2}$. Two goals of annealing were to eliminate BPDs in the epitaxial layers and to preserve the epitaxial surface morphology. There have been several previous attempts to anneal similar samples using high temperature microwave annealing as well as annealing under high $N_2$ pressure. With microwave annealing, BPDs were eliminated by annealing at above 1750° C. However, the surface morphology was poor. FIG. 2 compares the surface morphology using conventional annealing at above 1750° C. (FIG. 2a) with using the pulsed rapid thermal annealing of the present invention (FIG. 2b). Pulsed rapid thermal annealing improved surface morphology by about a factor of 2 compared to conventional annealing (RMS roughness of 3.1 nm compared to 5.7 nm).

The carbon capping technique was optimized but the microwave annealing performed at ambient pressure conditions was not able to achieve a good sample surface. Annealing under high pressure preserved the surface, however, could not go to temperatures higher than 1750° C. without damaging the cap. For complete BPD elimination, a much higher temperature anneal was required. Thus, the pulsed rapid thermal annealing process was adopted, resulting in a higher temperature annealing and preserving of the carbon cap.

Figure 3:
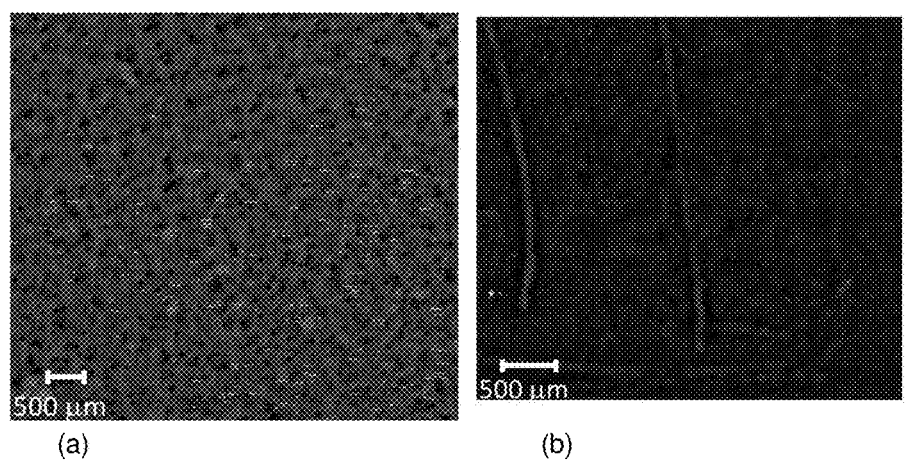
FIG. 3 shows ultraviolet photoluminescence (UVPL) images of the samples before and after the pulsed rapid thermal annealing process.

FIG. 3 shows UVPL images of the samples before (FIG. 3a) and after (FIG. 3b) the pulsed rapid thermal annealing process and indicates that a surface without any significant pits or generation of any new BPDs during the annealing process was produced. Such defects typically happen using conventional annealing at similar high temperatures. Almost all the BPDs that were previously present disappeared in the epilayer. It is proposed that during annealing BPDs that had not yet converted to threading edge dislocations (TED) during epigrowth forms a TED near the surface. Then the TEDs at the end of all the BPDs glide in a prismatic plane causing the BPD to shorten. Since this glide doesn't occur in the lower energy basal plane, the required energy for this glide is provided by the very high annealing temperature. This way a BPD segment converts to a TED with the TED glide and thus shortens the BPD. The UVPL images of the annealed samples also show a dot where the original BPD had propagated from the substrate, which represents a TED.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method to remove basal plane dislocations within a post growth silicon carbide epilayer attached to a silicon carbide substrate, the method comprising:
   a) applying an AZ 4620 photoresist to the silicon carbide epilayer and placing the silicon carbide epilayer and attached silicon carbide substrate inside an annealing chamber and substantially eliminating oxygen present in the annealing chamber;

b) capping the silicon carbide epilayer inside the annealing chamber by heating the AZ 4620 photoresist on the silicon carbide epilayer to a temperature of 1100° C. to form a carbon cap;
c) generating a substantially oxygen free overpressure environment inside the annealing chamber which contains the capped silicon carbide epilayer and attached silicon carbide substrate; and
d) performing a plurality of heating and cooling cycles to heat and cool the capped silicon carbide epilayer exposed to the substantially oxygen free overpressure environment inside the annealing chamber, wherein each heating and cooling cycle comprises heating the capped silicon carbide epilayer to a temperature between 1750° C. and 1875° C. and cooling the capped silicon carbide epilayer to a temperature between 1500 and 1550° C., and wherein the capped silicon carbide epilayer is heated to a temperature between 1750° C. and 1875° C. for a cumulative time duration of 5 minutes.

2. The method of claim 1, wherein the post growth silicon carbide epilayer is a 4° offcut, 4H—SiC epilayer.

3. The method of claim 1, further comprising:
purging gas process lines with ultrapure nitrogen to substantially eliminate ambient oxygen.

4. The method of claim 1, further comprising:
imaging the post growth silicon carbide epilayer to measure a reduction or elimination of basal plane dislocations within the post growth silicon carbide epilayer after the step d).

5. The method of claim 1, wherein the overpressure environment inside the annealing chamber is an ultrapure $N_2$ over pressure environment at 0.41-0.76 MPa.

6. The method of claim 1, wherein the method is performed for a batch of a plurality of individual silicon carbide epilayers respectively attached to a plurality of silicon carbide substrates.

* * * * *